United States Patent Office 3,467,523
Patented Sept. 16, 1969

3,467,523
LIGHT-SENSITIVE COMPOSITIONS FOR PHOTOMECHANICAL PURPOSES

Bernhard Seidel, Helmut Mader, Justus Danhauser, Herbert Bartl, Leverkusen, Germany, assignor to Gevaert-Agfa N.V., Mortsel, Belgium, a Belgian company

No Drawing. Filed July 2, 1965, Ser. No. 469,332
Claims priority, application Germany, Dec. 24, 1964, A 47,993
Int. Cl. G03c *1/70;* C08f *3/92*
U.S. Cl. 96—115 11 Claims

ABSTRACT OF THE DISCLOSURE

The disclosed light-sensitive material comprises a support and a layer thereon capable of being cross-linked by the action of light. The light-sensitive layer comprises polymers containing approximately one azidosulphonyl group per four to fifty monomer units. The preferred polymers are homo-polymers or co-polymers of olefins, e.g., polyalkylenes. Small amouts of other monomer units may be included in the polymer chain. Especially suitable co-polymers are the co-polymers of vinyl acetate, vinyl alcohol, ethylene, norbornadiene, cyclopentadiene, or co-polymers of butadiene or isoprene with styrene and/or acrylonitrile. These polymers are capable of being cross-linked photochemically, but are thermally stable and resistant to acids. Thus, these light-sensitive materials are useful for various photomechanical purposes, e.g., for the manufacture of acid-proof etching resists for printed circuits or for the preparation of masters or coated plates for printing purposes.

This invention relates to light-sensitive layers for different photomechanical purposes e.g. for the manufacture of acidproof etching resists particularly for printed circuits or for the preparation of masters or coated plates for printing purposes.

It is known already to use as light-sensitive substances polymers, which during exposure cross-link as a thin layer on a suitable support, i.e. which are image-wise hardened, so that, by subsequent development with a solvent or solvent system appropriate for the particular polymer, the non-cross-linked parts of the layer can be dissolved out whereas the cross-linked parts of the layer are insoluble and remain on the support as a relief. Such polymer systems with inherent sensitivity of the layer, which are used without additional photochemically cross-linking agents such as dichromates or diazides and which are added e.g. to water-soluble polymers or natural products such as polyvinyl alcohol, gelatin, and albumines, or to organophilic substances such as cyclized rubber or copolymers of butadienes and styrene have been described many times. Examples of such light-sensitive polymers are cinnamic acid esters of polyvinyl alcohol and cinnamic acid esters, attached to polyvinyl alcohol chains by means of an urethan group as well as chalcones linked in the same way to polymers.

It is also known to prepare polymers containing azide groups, which polymers have an inherent sensitivity to light and to ultra-violet radiation. Such polymers and copying layers prepared therewith are described e.g. in the German specifications 1,079,949 and 1,114,706, the latter specification also dealing with the use of diazo compounds. However, in cross-linked state these light-sensistive polymers usually do not possess a sufficient resistance against strong acids so that the use thereof e.g. in the preparation of etched circuits with noble metals is limited. Other polymers known hitherto do have a high resistance against acids but they are not sufficiently thermostable. Consequently the light-sensitive polymer cross-links already during storage.

It has been found now that a light-sensitive material comprising a support and a layer thereon capable of being cross-linked by the action of light displays a high sensitivity, a high resistance against acids and sufficient thermostability, when the light-sensitive layer comprises polymers that are capable of being cross-linked photochemically and which includes aliphatic azidosulphonyl groups. Appropriate chain members for the polymer chain are units of polymerised olefines such as units of ethylene, propylene, or butadiene. The polymers may, however, also comprise small amounts of other monomer units. Such polymers are obtained by copolymerisation of the olefines with vinyl acetate, acrylonitrile, vinyl chloride, vinylidene chloride, esters of acrylic acid or methacrylic acid, styrene, etc. It is not necessary that each of the monomer units should comprise an azidosulphonyl group.

The number of azidosulphonyl groups must be selected so that a high degree of cross-linking is guaranteed and that at the same time the solubility and the adhesion of the light-sensitive polymer to the support are not impaired. Preferred are the light-sensitive polymers, that comprise approximately one azidosulphonyl group per 4 to 50 monomer units in the polymer chain. According to a preferred embodiment use is made of polyethylenes or of copolymers of ethylene containing azidosulphonyl groups and other copolymerisable vinyl compounds, especially vinyl acetate.

The light-sensitive polymers can be utilised alone or as a physical mixture with other polymers. In many cases the second possibility offers definite advantages since mixtures having specific properties can be prepared.

Appropriate mixture components are homopolymers or copolymers of vinyl acetate, ethylene, derivatives of acrylic or methacrylic acid such as acrylic acid amide and methacrylic acid esters, particularly with short chain aliphatic alcohols, further butadiene, isoprene, styrene, or vinyl alcohol. Particularly suited are copolymers of vinyl acetate, vinyl alcohol, ethylene, norbornadiene, or cyclopentadiene, copolymers of butadiene or isoprene with styrene and/or acrylonitrile.

The polymer mixtures offer the advantage that an undesired premature cross-linking of the light-sensitive polymers during preparation of the layer is almost completely avoided.

It is also possible by proper selection of the second polymer component to prepare mixture having desired properties e.g. with respect to their adhesion to a particular support, their chemical resistance and their facility of cross-linking with the sulphimenes that presumably originate during exposure from the polymers containing azidosulphonyl groups. Polymers, which still comprise double bonds of olefinic or aromatic nature have proved to be particularly suitable. In this connection it must be borne in mind only that the mixture components used do possess the required chemical properties. Such double bond systems can be included in any form whatever in the main chain or in the side chains of the polymers. Examples thereof are butyl rubber and copolymers with cyclopentadiene or bornadiene.

The polymer or copolymer comprising azidosulphonyl groups preferably constitutes a part of the physical mixture whereas the other part comprises polymers or copolymers that carry molecule components (such as double bonds etc.) which through the action of light react very easily with the intermediates formed from the polymers comprising azidosulphonyl groups.

The proportion of polymers containing azidosulphonyl groups to the mixture components depends first of all on the content of azidosulphonyl groups in the light-sensitive polymers. For the above-mentioned suitable polymers comprising one azidosulphonyl group per 4 to 50 polymerised units, a proportion of approximately 10% by weight of light-sensitive components calculated on the total weight of polymeric material present may suffice in many cases. Mixtures containing 40% by weight and more of light-sensitive polymers are preferred, however.

The preparation of a light-sensitive polymer according to the invention is performed as follows: 47 g. of chlorosulphonated polyethylene with 1.25% of sulphur in the form of chlorosulphonyl groups and 29% of total chlorine are dissolved in 750 ml. of benzene. At 0 to 5° C. a solution of 6.5 g. of sodium azide in 90 ml. of water is added dropwise while thoroughly stirring. The mixture is vigourously stirred for 24 h. at room temperature. Care must be taken that both phases are mixed thoroughly. After separation of the aqueous phase the polymer is precipitated by means of acetone, separated from the solvent, and dried in an air current.

The same process can also be applied to appropriate chlorosulphonated ethylene copolymers, such as those with acrylonitrile, vinyl acetate, acrylic acid, or butadiene. By copolymerisation of ethylene with suitable monomers the properties of the light-sensitive polymers containing azidosulphonyl groups can be adapted with regard to their solubility, their chemical resistance and their sensitivity.

For the preparation of the light-sensitive layers according to the present invention the polymers are dissolved in appropriate organic solvents such as chlorinated hydrocarbons e.g. chloroform, higher ketones, or dimethylformamide and by dipping, spraying, or coating, applied to support materials such as paper foils e.g. Japan paper for screen-printing, metals such as magnesium, aluminium, copper, zinc, iron, steel, titanium, tantalium, niobium, silver, gold, etc., particularly the noble metals for printed or etched circuits, synthetic materials such as polyamides, polyesters, polycarbonates, or cellulose-derivatives.

In consequence of their high resistance to acids the light-sensitive polymers or mixtures of polymers according to the invention are particularly suited for the preparation of printed or etched circuits, for etching structural elements for aircrafts or space vehicles, and for engraving steel rollers.

The light-sensitivity of the layers prepared with polymers or polymer systems applied according to the invention can be enhanced considerably by adding sensitising agents. Appropriate sensitising agents are Michler's ketone, 4-dimethylaminobenzaldehyde, 4-H-quinolizine-4-one, compounds from the group of the naphthothiazolines, pyrazolones, etc. By the addition of such compounds the light-sensitive layer also becomes sensitive to longer wavelengths, so that the total sensitivity of the layer is increased. All substances meeting these requirements can be used for sensitising the polymers according to the invention, if only they are compatible with these polymers.

The exposure of the light-sensitive layer prepared according to the invention is carried out by means of light sources known in the reproduction technique such as carbon arc lamps, xenon lamps, mercury vapour lamps as well as sunlight, which all of them besides visible radiation also emit ultraviolet radiation, which is particularly active for photochemically cross-linking. The development of exposed layers is generally carried out with organic solvents of suitable composition, which may but need not be similar to or identical with the solvents for the polymer before cross-linking such as chlorinated or aromatic hydrocarbons, higher esters and ketones, as well as strong polar substances such as dimethyl sulphoxide and dimethylformamide.

The following examples illustrate the present invention.

Example 1

2.5 g. of a polychloroethylene sulfonazide are dissolved in 40 ml. of chloroform and admixed with 50 mg. of Michler's ketone. A thin layer of 5 to 12 micron is coated from this mixture on a cleaned and degreased zinc plate. The resulting layer is dried for 5 minutes to the air. The light-sensitive element thus obtained is then exposed for 1 to 2 minutes behind a line original to a carbon arc lamp of 15 amp and 45 v. placed at a distance of 30 cm. Subsequently the plate is developed for 1 to 2 minutes at 20° C. in a mixture of equal parts of benzene, toluene, and chloroform. A negative copy having sharp contours is obtained. A metal relief in accordance with the original is then prepared by etching for several minutes in a bowl containing 15% aqueous nitric acid and 0.05% aqueous saponine. The metal relief so obtained can be used e.g. as a printing plate.

Example 2

Example 1 is repeated, with the proviso however, that an aluminium support is used and that the light-sensitive polymer is sensitised with 40 mg. of 4-dimethylaminobenzaldehyde. After coating, exposure and development the same results are obtained as in Example 1. A printing plate is made by etching in 5% nitric acid.

Example 3

2.5 g. of a polychloroethylene sulfonazide are dissolved in 30 ml. of chloroform and mixed with a solution comprising 2.5 g. of a copolymer of ethylene, vinyl acetate and norbornadiene according to the German patent application (F 42,814). To this mixture are added 100 mg. of Michler's ketone. The resulting composition is then dip-coated on an etchable zinc plate so as to obtain a polymer film having a thickness of several micron. The thus prepared light-sensitive material is exposed and developed as described in Example 1. If a drop of a mixture consisting of nitric acid (65%) concentrated sulphuric acid, aqua regia, sodium hydroxide (20%) is applied to the cross-linked parts of the polymer layer, the latter is not destroyed by the action of these reagents whereas the layer of a comparison test of e.g. the polymer (described in the U.S. patent specification 2,610,120) consisting of an ester of polyvinyl alcohol and cinnamic acid chloride is destroyed by the concentrated acids after a few seconds.

Example 4

4 g. of a polychloroalklene sulfonazide are dissolved in 50 ml. of chloroform and admixed with a solution of 5 g. of a polyisoprene e.g. a purified natural rubber in 50 ml. of chloroform. After the addition of 90 mg. of Michler's ketone a zinc plate is coated with the mixture. The same procedure as in Example 3 is then continued.

What we claim is:

1. In a light-sensitive material comprising a support and a layer thereon capable of being cross-linked by the action of light, the improvement wherein the said light-sensitive layer comprises a polymer that is capable of being cross-linked photochemically and which includes azidosulphonyl groups attached to the polymer chain.

2. A light-sensitive material according to claim 1 wherein the said light-sensitive polymer comprises approximately one azidosulphonyl group per four to fifty monomer units.

3. A light-sensitive material according to claim 1 wherein the said light-sensitive layer contains a polymer of an olefin capable of being cross-linked photochemically, said polymer containing azidosulphonyl groups attached to the polymer chain.

4. A light-sensitive material according to claim 3 wherein an azidosulphonyl group-containing polymer of ethylene is incorporated into the light-sensitive layer as a polymer capable of being cross-linked photochemically.

5. A light-sensitive material according to claim 1 wherein the said light-sensitive layer contains another film-forming polymer in addition to the said polymer capable of being cross-linked photochemically and comprising azidosulphonyl groups.

6. A light-sensitive material according to claim 5 wherein the said light-sensitive layer comprises, in addition to said polymer capable of being cross-linked photochemically and comprising azidosulphonyl groups, a polymer of a monomer selected from the group consisting of vinyl acetate, ethylene, derivatives of acrylic acid, derivatives of methacrylic acid, butadiene, isoprene, styrene, cyclopentadiene, norbornadiene, and vinyl alcohol.

7. A light-sensitive material comprising an olefinic polymer having as substituents azidosulphonyl groups attached to the polymer chain and a sensitizer.

8. The light-sensitive material of claim 7 wherein the azidosulphonyl groups are attached to polyalkylene.

9. The light-sensitive material of claim 8 wherein the polyalkylene is polyethylene.

10. The light-sensitive material of claim 9 wherein the polyethylene is chlorinated.

11. The light-sensitive material of claim 7 comprising one azidosulphonyl group per four to fifty monomer units.

References Cited

UNITED STATES PATENTS

| | | | |
|---|---|---|---|
| 2,948,610 | 8/1960 | Merrill et al. | 96—33 |
| 3,058,944 | 10/1962 | Breslow et al. | 260—41 |
| 3,143,423 | 8/1964 | Reynolds et al. | 96—91 |
| 3,203,936 | 8/1965 | Breslow et al. | 260—79.3 |
| 3,261,785 | 7/1966 | Robinson | 260—2.5 |
| 3,278,305 | 10/1966 | Laridon et al. | 96—91 |
| 3,301,841 | 1/1967 | Burleigh et al. | 260—94.4 |
| 3,345,171 | 10/1967 | Laridon et al. | 96—36 |

OTHER REFERENCES

Hackh, I.: "Chemical Dictionary," Third Edition, 1944 page 817.

NORMAN G. TORCHIN, Primary Examiner

R. H. SMITH, Assistant Examiner

U.S. Cl. X.R.

96—91; 260—79.3